(12) United States Patent
Nomura et al.

(10) Patent No.: US 12,707,676 B2
(45) Date of Patent: Aug. 11, 2026

(54) SEMICONDUCTOR DEVICE, SEMICONDUCTOR MODULE, AND METHOD FOR MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazushiro Nomura, Kawasaki Kanagawa (JP); Kenichi Ohashi, Kawasaki Kanagawa (JP); Soichi Yamashita, Kawasaki Kanagawa (JP); Kentaro Mori, Fujisawa Kanagawa (JP); Aya Murayoshi, Ichihara Chiba (JP); Hiroki Okuyama, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 386 days.

(21) Appl. No.: 18/508,612

(22) Filed: Nov. 14, 2023

(65) Prior Publication Data

US 2024/0313120 A1 Sep. 19, 2024

(30) Foreign Application Priority Data

Mar. 15, 2023 (JP) ................................ 2023-041353

(51) Int. Cl.
*H10D 30/67* (2025.01)
*H10D 30/01* (2025.01)
(Continued)

(52) U.S. Cl.
CPC ....... *H10D 30/6728* (2025.01); *H10D 30/031* (2025.01); *H10D 30/6729* (2025.01);
(Continued)

(58) Field of Classification Search
CPC ............. H10D 30/6728; H10D 30/031; H10D 30/6729; H10D 64/252; H10D 84/013;
(Continued)

(56) References Cited

U.S. PATENT DOCUMENTS

| | | |
|---|---|---|
| 6,933,606 B2 | 8/2005 | Kurosawa |
| 8,012,805 B2 | 9/2011 | Arita et al. |

(Continued)

FOREIGN PATENT DOCUMENTS

| | | |
|---|---|---|
| JP | 2890851 | 5/1999 |
| JP | 2004-140179 A | 5/2004 |

(Continued)

OTHER PUBLICATIONS

Office Action issued in Japanese Patent Application No. 2023-041353 dated Nov. 15, 2025, in 6 pages.

(Continued)

*Primary Examiner* — Douglas W Owens
(74) *Attorney, Agent, or Firm* — Knobbe, Martens, Olson & Bear, LLP

(57) ABSTRACT

A semiconductor device according to an embodiment includes a first electrode having a first main surface and a second main surface opposite to the first main surface, a semiconductor substrate disposed on the second main surface, and a second electrode disposed on a fourth main surface of the semiconductor substrate opposite to a third main surface in contact with the first electrode. The first electrode has a first side surface substantially perpendicularly intersecting with the first main surface, and a second side surface substantially perpendicularly intersecting with both the first main surface and the first side surface, and the first main surface, the first side surface, and the second side surface are connected to each other via a curved surface.

16 Claims, 28 Drawing Sheets

(51) Int. Cl.

| | |
|---|---|
| ***H10D 64/23*** | (2025.01) |
| ***H10D 84/01*** | (2026.01) |
| ***H10D 84/03*** | (2025.01) |
| ***H10P 72/70*** | (2026.01) |

(52) U.S. Cl.
CPC ......... *H10D 64/252* (2025.01); *H10D 84/013* (2025.01); *H10D 84/016* (2025.01); *H10D 84/038* (2025.01); *H10P 72/7402* (2026.01)

(58) Field of Classification Search
CPC ................ H10D 84/016; H10D 84/038; H10P 72/7402; H10P 72/7416; H10P 54/00; H10W 70/04; H10W 70/421; H10W 74/111; H10W 70/417
See application file for complete search history.

(56) References Cited

U.S. PATENT DOCUMENTS

| | | | | |
|---|---|---|---|---|
| 12,477,829 | B2 | 11/2025 | Ota et al. | |
| 2009/0098712 | A1 | 4/2009 | Taguchi et al. | |
| 2011/0227201 | A1* | 9/2011 | Too | H10W 42/121 257/618 |
| 2013/0001573 | A1* | 1/2013 | Lee | H10D 64/62 438/156 |
| 2016/0197172 | A1* | 7/2016 | Majima | H10D 30/402 427/99.5 |
| 2023/0137754 | A1* | 5/2023 | Tadokoro | H10P 54/00 438/462 |
| 2024/0055536 | A1* | 2/2024 | Arima | H10D 8/605 |

FOREIGN PATENT DOCUMENTS

| | | | |
|---|---|---|---|
| JP | 2006-294688 | A | 10/2006 |
| JP | 2006-295066 | A | 10/2006 |
| JP | 2007-049041 | A | 2/2007 |
| JP | 2007-165371 | | 6/2007 |
| JP | 2009-099681 | A | 5/2009 |
| JP | 2013-161944 | | 8/2013 |
| JP | 2015-173187 | A | 10/2015 |
| WO | WO 2022/059381 | A1 | 3/2022 |

OTHER PUBLICATIONS

Office Action issued in Japanese Patent Application No. 2023-041353 dated Nov. 25, 2025, in 6 pages.

* cited by examiner

SEMICONDUCTOR DEVICE, SEMICONDUCTOR MODULE, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2023-041353, filed on Mar. 15, 2023; the entire contents of which are incorporated herein by reference.

FIELD

Embodiments described herein relate generally to a semiconductor device, a semiconductor module, and a method for manufacturing a semiconductor device.

BACKGROUND

In a semiconductor module including a semiconductor device such as a vertical metal oxide semiconductor field effect transistor (MOSFET), an electrode of the semiconductor device is electrically connected to a lead material (metal member) via a bonding material such as solder.

Since the semiconductor device is formed by dividing a wafer on which an electrode layer is formed by dicing, a corner of the electrode have an angular shape. Therefore, in the semiconductor module, stress tends to concentrate on the corner of the electrode due to thermal expansion or the like of the bonding material. As a result, there is a concern that a semiconductor substrate is damaged in a case where a change in environmental temperature is large.

DETAILED DESCRIPTION

Figure 1:
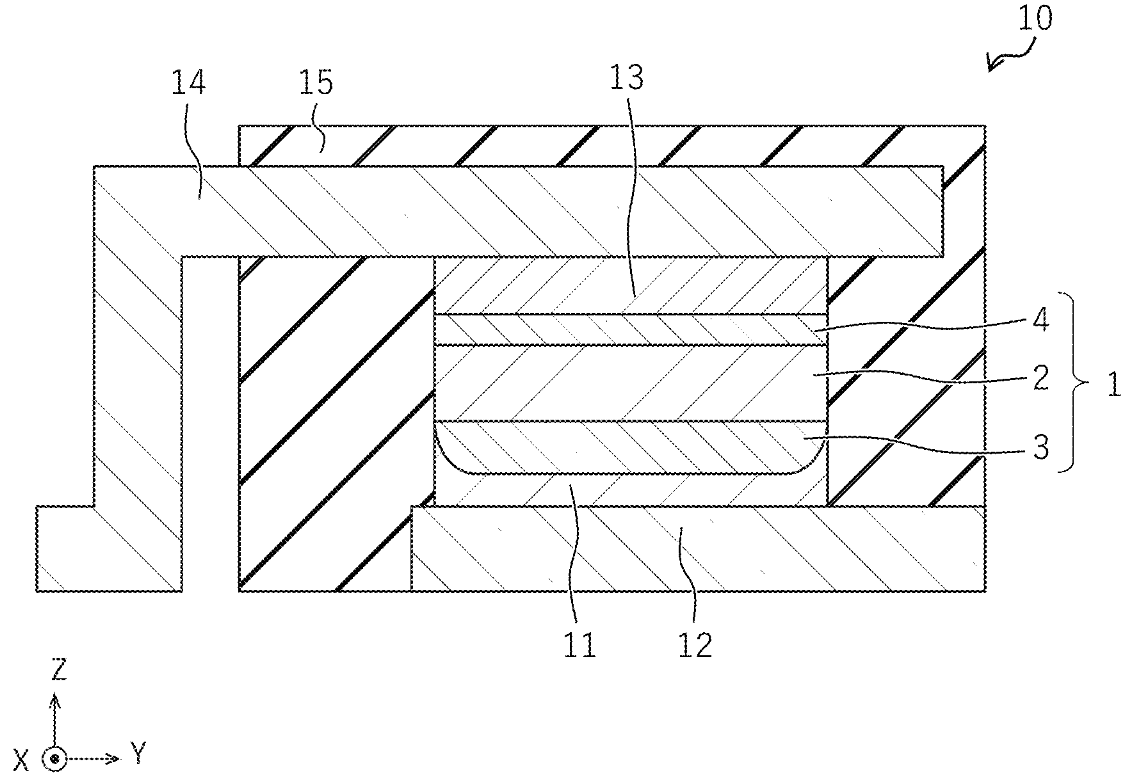
FIG. 1 is a cross-sectional view of a semiconductor module according to a first embodiment.

A semiconductor device according to an embodiment includes a first electrode having a first main surface and a second main surface opposite to the first main surface, a semiconductor substrate disposed on the second main surface, and a second electrode disposed on a fourth main surface of the semiconductor substrate opposite to a third main surface in contact with the first electrode. The first electrode has a first side surface substantially perpendicularly intersecting with the first main surface, and a second side surface substantially perpendicularly intersecting with both the first main surface and the first side surface, and the first main surface, the first side surface, and the second side surface are connected to each other via a curved surface.

Embodiments will now be explained with reference to the accompanying drawings. The embodiments do not limit the present invention. The drawings are schematic or conceptual, and a ratio between portions and the like are not necessarily the same as actual ones. In the specification and the drawings, elements similar to those described above regarding the previously described drawings are denoted by the same reference numerals, and detailed description thereof is appropriately omitted.

In the present specification, XYZ coordinates are employed, a thickness direction of a semiconductor device (stacking direction of an electrode 3, a semiconductor substrate 2, and an electrode 4 to be described later) is defined as a Z direction, one direction substantially orthogonal to the Z direction is defined as an X direction, and a direction substantially orthogonal to the X direction and the Z direction is defined as a Y direction.

First Embodiment

A semiconductor device 1 according to a first embodiment will be described with reference to FIGS. 1 and 2A to 2D.

First, a semiconductor module 10 including the semiconductor device 1 will be described. FIG. 1 is a cross-sectional view illustrating a configuration example of the semiconductor module 10. The semiconductor module 10 includes the semiconductor device 1, a bonding material 11, a metal member 12, a bonding material 13, a metal member 14, and a sealing material 15.

The bonding material 11 electrically connects an electrode 3 of the semiconductor device 1 and the metal member 12. The bonding material 11 is, for example, solder. The bonding material 11 may be a sintered material sintered between the electrode 3 and the metal member 12 by performing heat treatment.

The metal member 12 is disposed to be electrically connected to the electrode 3 via the bonding material 11. A conductive material such as copper is used for, for example, the metal member 12.

The bonding material 13 electrically connects an electrode 4 of the semiconductor device 1 and the metal member 14. The bonding material 13 is, for example, solder. The bonding material 13 may be a sintered material sintered between the electrode 4 and the metal member 14 by performing heat treatment. For example, copper (Cu), silver (Ag), lead (Pb), tin (Sn), or a combination thereof may be used for the bonding materials 11 and 13.

The metal member 14 is disposed to be electrically connected to the electrode 4 via the bonding material 13. A conductive material such as copper is used for, for example, the metal member 14.

The sealing material 15 seals the semiconductor device 1 and protects the semiconductor device 1 from an outside of the sealing material 15. The sealing material 15 may seal a part or all of at least one of the bonding material 11, the metal member 12, the bonding material 13, and the metal member 14. The sealing material 15 has an insulating property, and, for example, a resin is used.

Figure 2A:
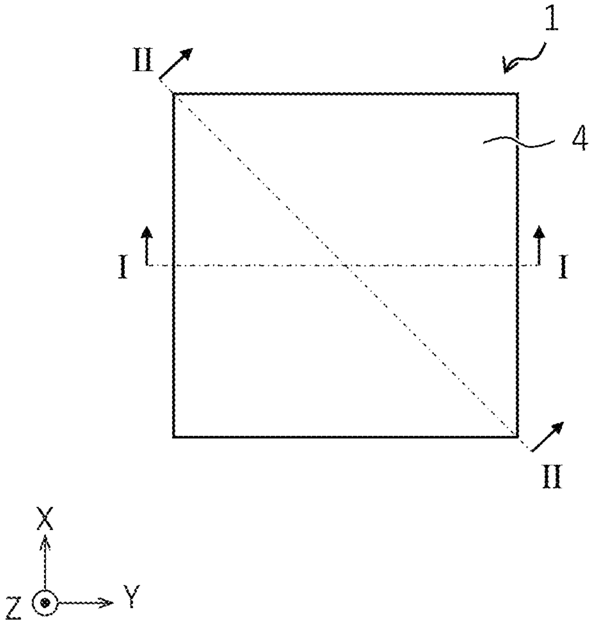
FIG. 2A is a top view of the semiconductor device according to the first embodiment.
Figure 2B:
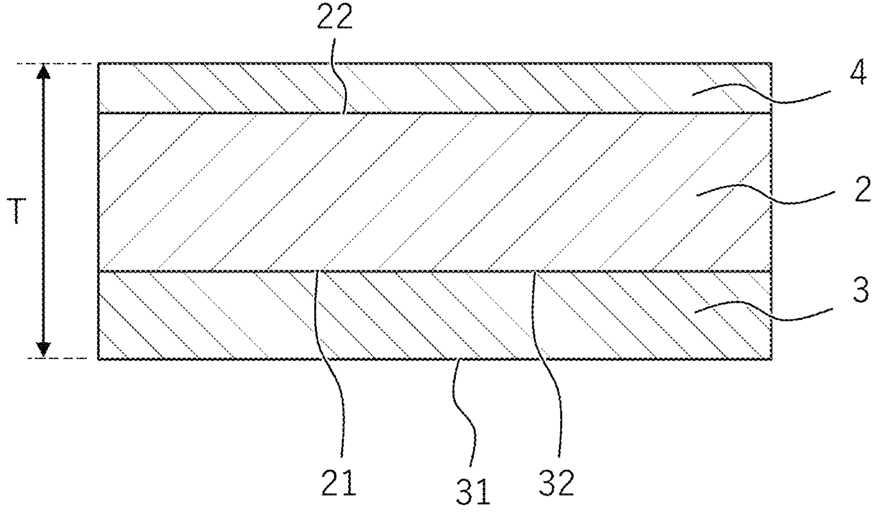
FIG. 2B is a cross-sectional view taken along line I-I of the semiconductor device illustrated in FIG. 2A.
Figure 2C:
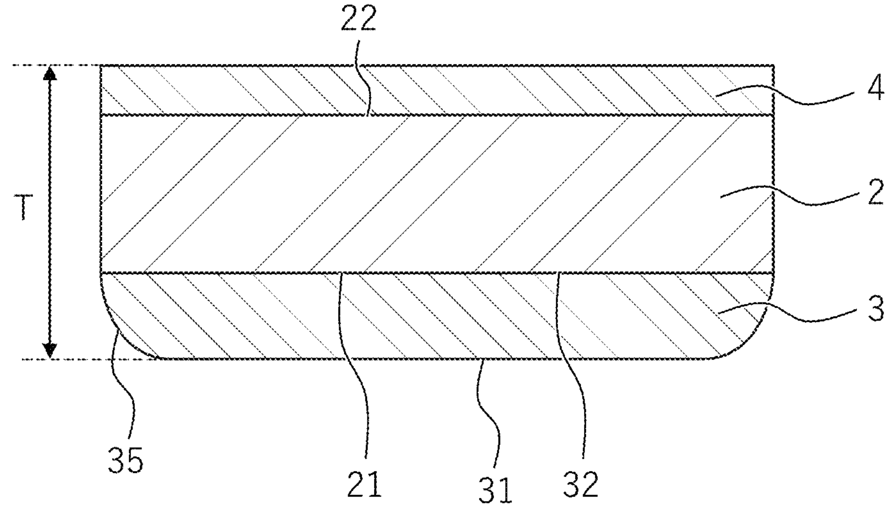
FIG. 2C is a cross-sectional view taken along line II-II of the semiconductor device illustrated in FIG. 2A.

Next, the semiconductor device 1 will be described. FIG. 2A is a plan view of the semiconductor device 1 according to the first embodiment. FIG. 2B is a cross-sectional view taken along line I-I in FIG. 2A. FIG. 2C is a cross-sectional view taken along line II-II in FIG. 2A.

The semiconductor device 1 includes the semiconductor substrate 2, the electrode (first electrode) 3, and the electrode (second electrode) 4. The semiconductor device 1 is configured to cause a current to flow between the electrode 4 and the electrode 3, as a semiconductor element. The semiconductor device 1 may be a vertical MOSFET. In a case where the semiconductor device 1 is a MOSFET, the electrode 3 corresponds to a drain electrode, and the electrode 4 corresponds to a source electrode. More specifically, the semiconductor device 1 may be a low voltage MOSFET (LVMOSFET).

The semiconductor substrate 2 is obtained by, for example, forming a semiconductor element on a wafer formed by slicing a silicon ingot and dividing the wafer into individual pieces. Silicon (Si), silicon carbide (SIC), or gallium nitride (GaN) is used for, for example, the semiconductor substrate 2. As illustrated in FIGS. 2B and 2C, the semiconductor substrate 2 has a main surface 21 and a main surface 22 opposite to the main surface 21.

Figure 2D:
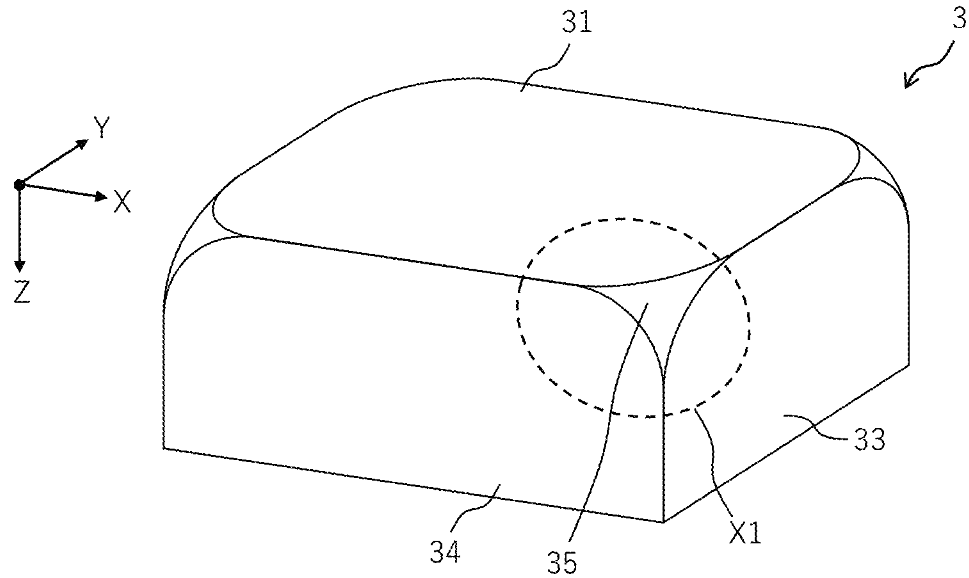
FIG. 2D is a stereoscopic perspective view of a first electrode included in the semiconductor device according to the first embodiment.

The electrode 3 has a main surface 31 and a main surface 32 opposite to the main surface 31. The semiconductor substrate 2 is disposed on the main surface 32. The main surface 21 of the semiconductor substrate 2 is in contact with the electrode 3. As illustrated in FIG. 2D, the electrode 3 has a side surface 33 substantially perpendicularly intersecting with the main surface 31, and a side surface 34 substantially perpendicularly intersecting with both the main surface 31 and the side surface 33.

The electrode 4 is disposed on the main surface 22 of the semiconductor substrate 2. In a case where the semiconductor device 1 is a vertical MOSFET, a gate electrode (not illustrated) is also disposed on the main surface 22.

A material such as copper, nickel (Ni), silver, gold (Au), or palladium (Pd) is used for, for example, the electrode 3 and the electrode 4.

A total T (thickness T) of thicknesses of the electrode 3, the semiconductor substrate 2, and the electrode 4 may be equal to or less than 50 μm. The thickness T is equal to or less than 50 μm, and thus, an on-resistance of the semiconductor device 1 can be sufficiently reduced.

As illustrated in FIGS. 2C and 2D, the main surface 31, the side surface 33, and the side surface 34 of the electrode 3 are connected to each other via a curved surface 35. Accordingly, the electrode 3 is rounded at a corner X1. In other words, the electrode 3 includes a rounded corner X1.

In the present embodiment, as illustrated in FIG. 2D, the electrode 3 is rounded not only at one corner but also at all corners. The electrode 3 may be rounded at at least one corner.

A radius of curvature of the curved surface 35 (that is, a radius of curvature of the corner X1) may be, for example, equal to or more than 10 μm. Accordingly, stress applied to the corner X1 of the electrode 3 can be more effectively dispersed.

As described above, according to the present embodiment, since the electrode 3 is rounded at the corner X1, stress applied to the corner X1 of the electrode 3 can be dispersed by the bonding material 11 in the semiconductor module 10. Accordingly, the reliability of the semiconductor device 1 can be improved.

<Method for Manufacturing Semiconductor Device 1>

Hereinafter, a method for manufacturing the semiconductor device 1 will be described with reference to the drawings. As an example of a manufacturing method for rounding the corner X1 of the electrode 3, a manufacturing method using etching or laser ablation processing will be described. FIGS. 3A to 3E illustrate a manufacturing method by etching (first example), and FIGS. 4A to 4D illustrate a manufacturing method by laser ablation (second example).

First Example (Etching)

Figure 3A:
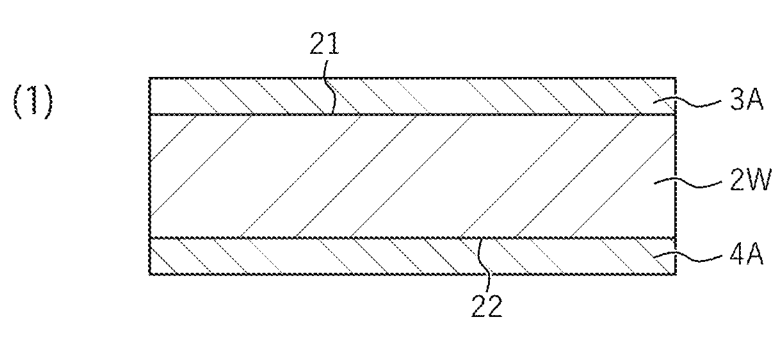
FIG. 3A is a cross-sectional view for describing steps in a first example of a method for manufacturing a semiconductor device according to the first embodiment.
Figure 3A:
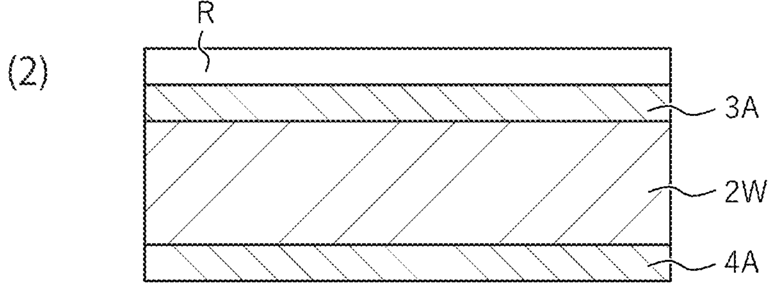
Figure 3A:
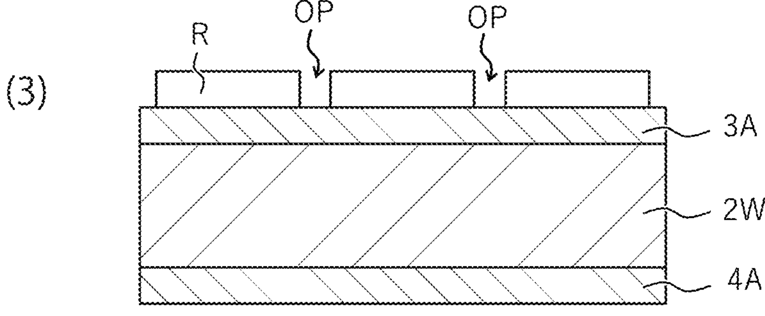
Figure 3A:
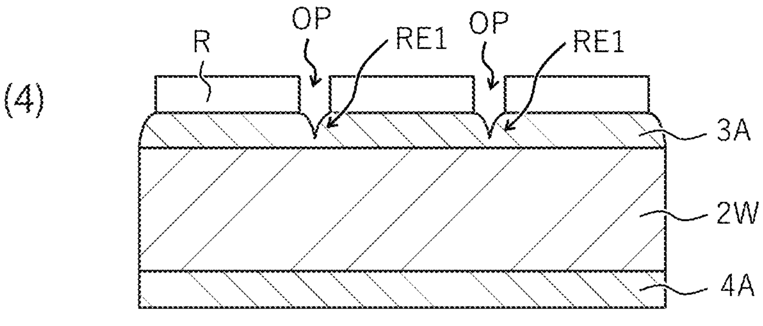

First, as illustrated in (1) of FIG. 3A, a wafer 2W having the main surface 21 and the main surface 22 opposite to the main surface 21 and having an electrode layer 3A disposed on the main surface 21 and an electrode layer 4A disposed on the main surface 22 is prepared. For reinforcement, the wafer 2W may be bonded to a support member (not illustrated) such as a glass plate. Various semiconductor regions are already formed on the wafer 2W, and the same applies to the following other examples. For example, in a case where the semiconductor device 1 is a vertical MOSFET, a base region, a source region, a drain region, and the like are formed on the wafer 2W.

Subsequently, as illustrated in (2) of FIG. 3A, a resist R is applied onto the electrode 3.

Figure 3B:
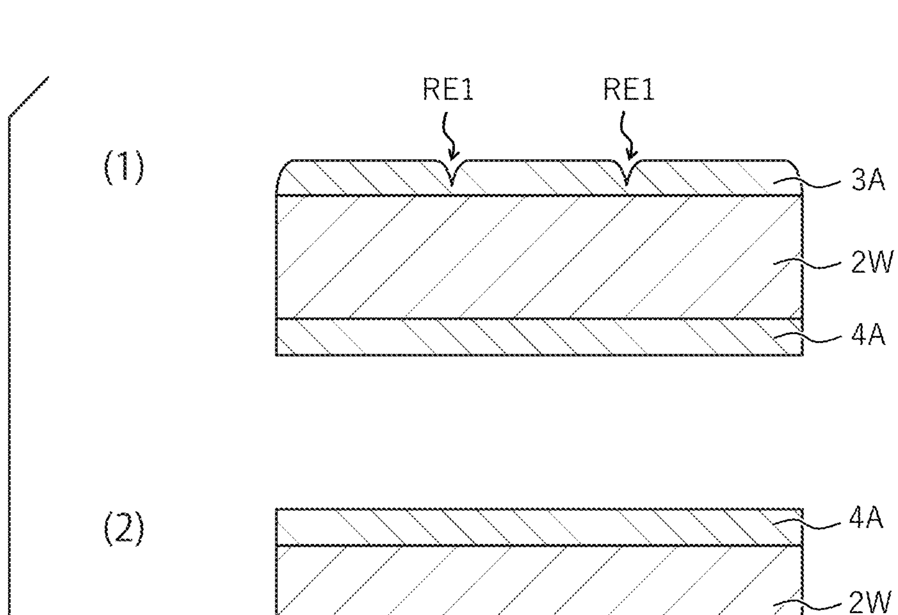
FIG. 3B is a cross-sectional view for describing steps in the first example of the method for manufacturing a semiconductor device according to the first embodiment, subsequently to FIG. 3A.
Figure 3B:
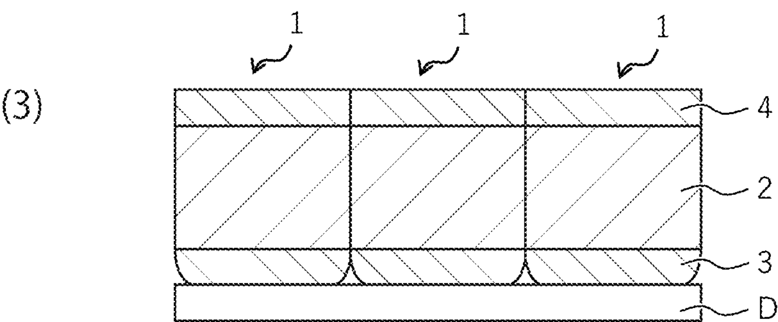
Figure 3B:
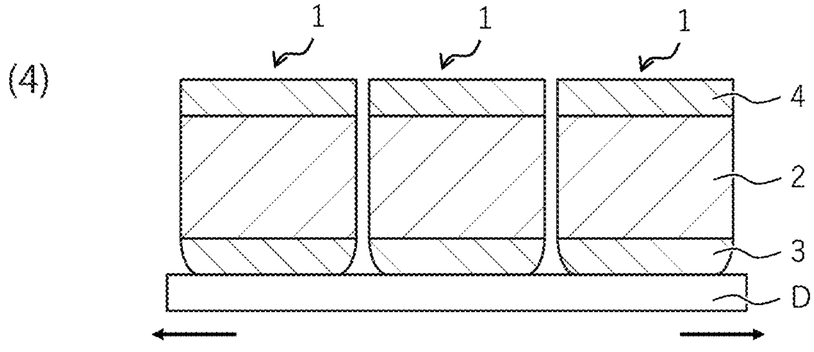
Figure 3C:
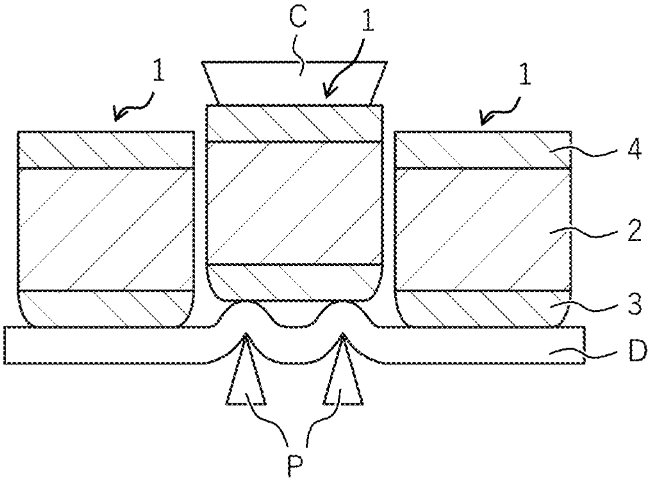
FIG. 3C is a cross-sectional view for describing steps in the first example of the method for manufacturing a semiconductor device according to the first embodiment, subsequently to FIG. 3B.
Figure 3D:
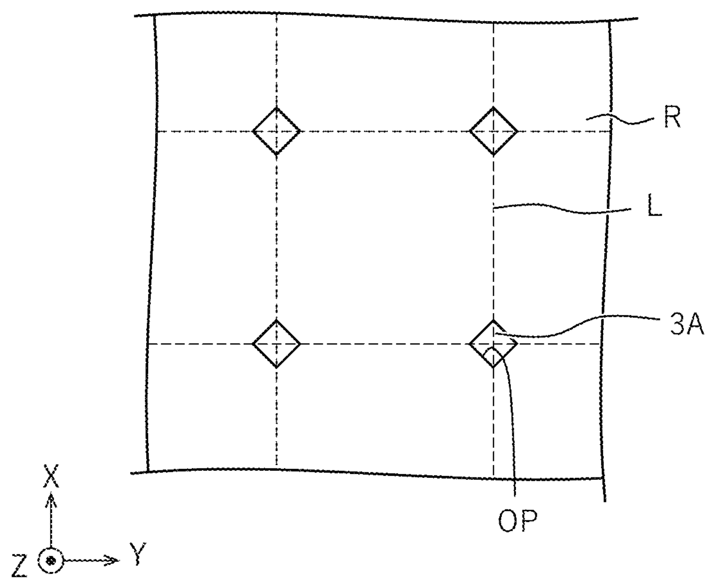
FIG. 3D is a top view for describing the step in the first example of the method for manufacturing a semiconductor device according to the first embodiment, illustrated in (3) of FIG. 3A.

Subsequently, as illustrated in (3) of FIG. 3A and FIG. 3D, the resist R is selectively exposed at a position corresponding to an intersection of dicing lines L of the wafer 2W. Thereafter, as illustrated in FIG. 3D, an opening OP through which the electrode layer 3A is exposed is formed in a lattice point shape (that is, at a position corresponding to the intersection of the dicing lines L) on a bottom surface by development. FIG. 3D is a top view of the state illustrated in (3) of FIG. 3A.

Although FIG. 3D illustrates a rectangular opening OP, a shape of the opening OP is not limited thereto, and may be any shape such as a circular shape.

Subsequently, as illustrated in (4) of FIG. 3A, the electrode layer 3A exposed on the bottom surface of the opening OP is etched, and thus, a plurality of recesses RE1 are formed in a lattice point shape in the electrode layer 3A. A depth of the recess RE1 is, for example, equal to or more than 10 μm. The etching is dry etching or wet etching. The recesses RE1 are formed, and thus, the electrode 3 included in the semiconductor device 1 is rounded at the corner X1 when the wafer 2W is divided into a plurality of semiconductor devices 1 later.

Figure 3E:
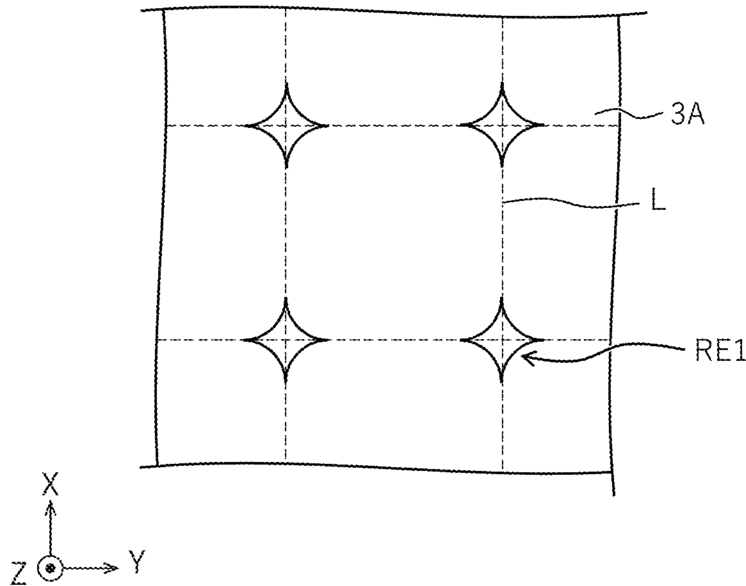
FIG. 3E is a top view for describing the step in the first example of the method for manufacturing a semiconductor device according to the first embodiment, illustrated in (1) of FIG. 3B.

Subsequently, as illustrated in (1) of FIG. 3B, the resist R is removed by using a developer or the like. Accordingly, as illustrated in FIG. 3E, the recess RE1 is disposed along the intersection of the dicing lines L.

Subsequently, as illustrated in (2) of FIG. 3B, a dicing tape D is attached onto the electrode layer 3A. Thereafter, in a case where the support member such as the glass plate is bonded to the wafer 2W, the support member is removed.

Subsequently, as illustrated in (3) of FIG. 3B, the wafer 2W is diced along the dicing lines L, and thus, the wafer 2W is divided into the plurality of semiconductor devices 1. The semiconductor device 1 includes the semiconductor substrate 2, the electrode 3, and the electrode 4. The dicing is performed by any method such as blade dicing or laser dicing.

Subsequently, as illustrated in (4) of FIG. 3B, the dicing tape D is stretched. Thereafter, as illustrated in (1) of FIG. 3C, the divided semiconductor device 1 is pushed up by using a push-up pin P and is picked up by using a collet C.

The picked-up semiconductor device 1 is conveyed to, for example, a die bonder and is placed on a lead frame (not illustrated) via the bonding material 11. Thereafter, the semiconductor module 10 is manufactured through a mounting step of the metal members 12 and 14, a wire bonding step of connecting the metal members 12 and 14 and the semiconductor device 1 with a wire, a molding step of sealing the semiconductor device 1 with the sealing material 15, and the like. Steps after picking up are similar in the following another example.

Through the above steps, the semiconductor device 1 according to the first embodiment is manufactured.

Next, the method for manufacturing the semiconductor device 1 using the laser ablation processing will be described.

Second Example (Laser Ablation)

Figure 4A:
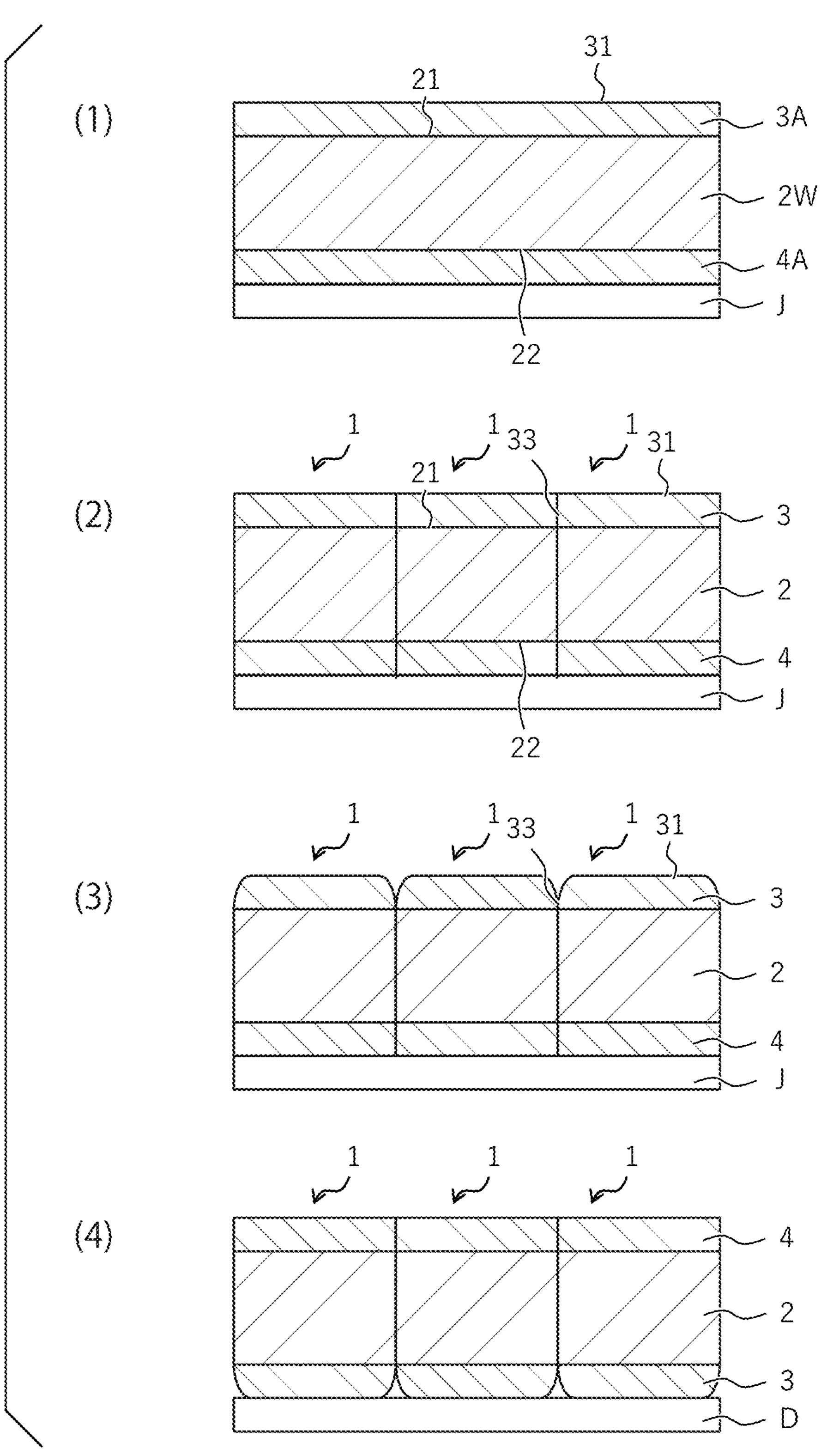
FIG. 4A is a cross-sectional view for describing steps in a second example of the method for manufacturing a semiconductor device according to the first embodiment.
Figure 4B:
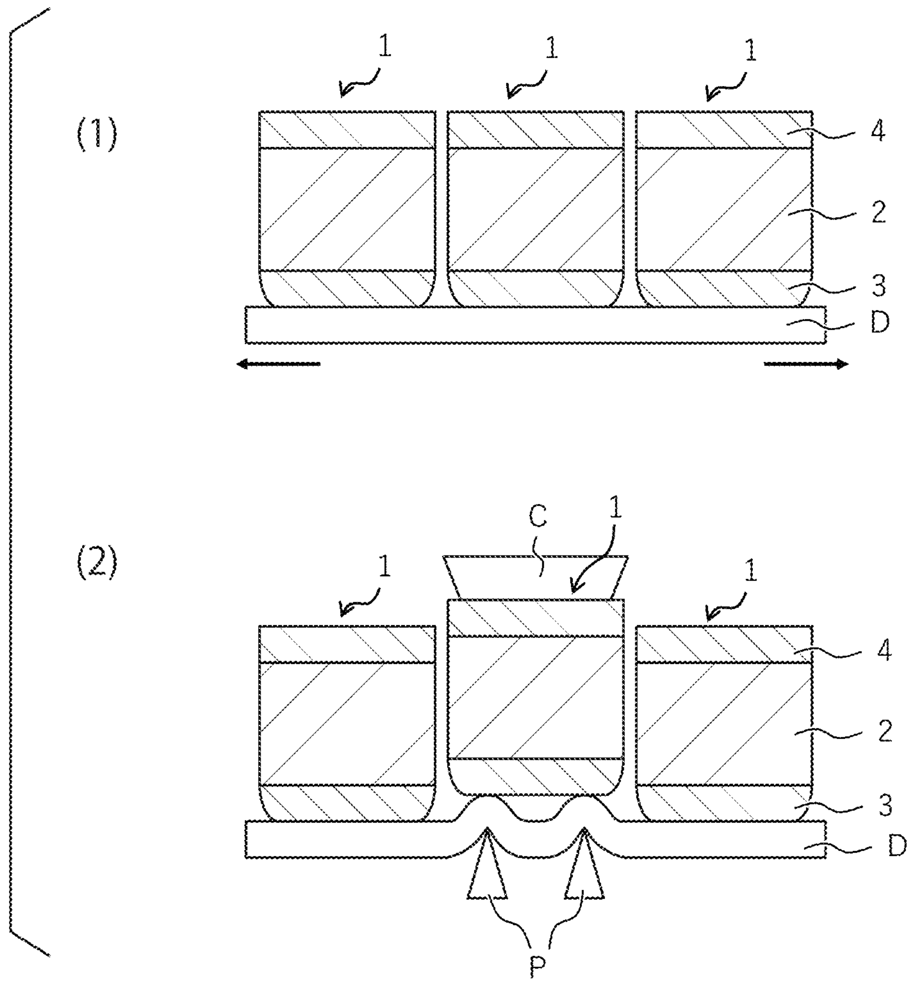
FIG. 4B is a cross-sectional view for describing steps in the second example of the method for manufacturing a semiconductor device according to the first embodiment, subsequently to FIG. 4A.

First, as illustrated in (1) of FIG. 4A, the wafer 2W having the main surface 21 and the main surface 22 opposite to the main surface 21 and having the electrode layer 3A disposed on the main surface 21 and the electrode layer 4A disposed on the main surface 22 is prepared. The wafer 2W is supported by, for example, a support jig J. The support jig J is, for example, glass or a dicing tape.

Subsequently, as illustrated in (2) of FIG. 4A, the wafer 2W is diced along the dicing lines L, and thus, the wafer 2W is divided into the plurality of semiconductor devices 1. Accordingly, the electrode 3 having the side surface 33 and the side surface 34 is formed. The dicing is performed by any method such as blade dicing or laser dicing.

Figure 4C:
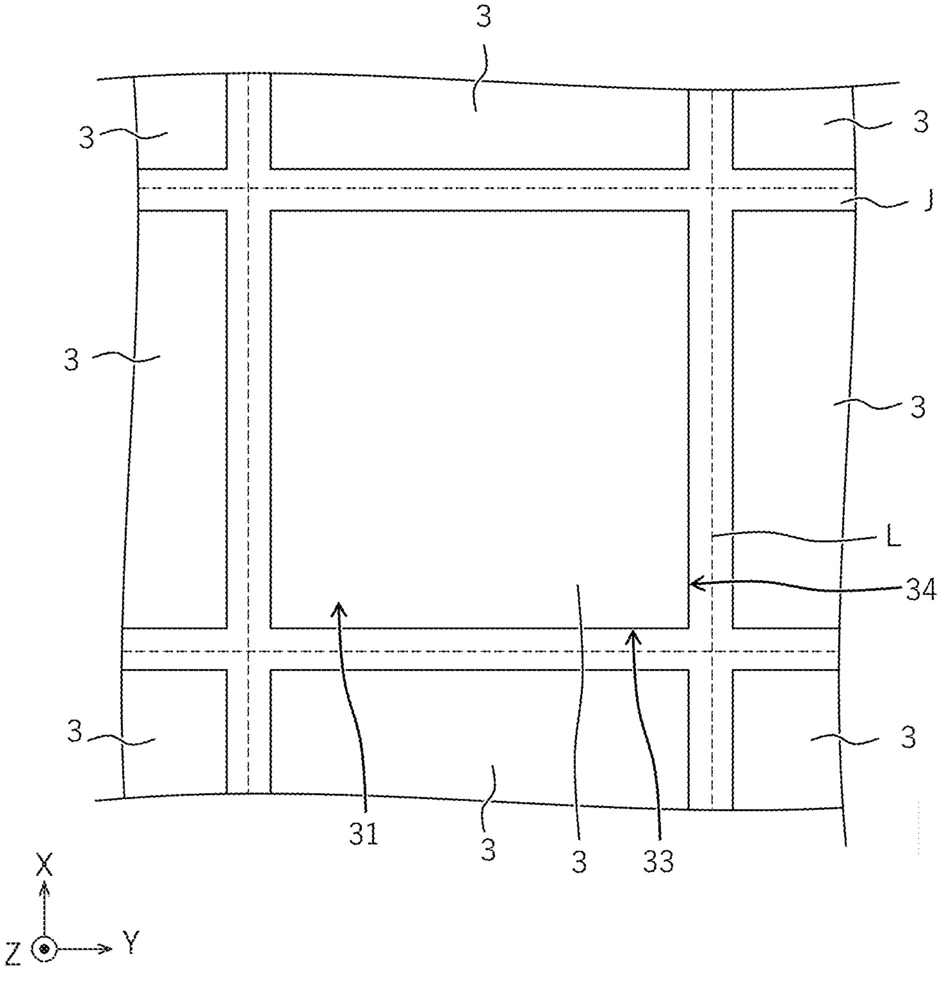
FIG. 4C is a top view for describing the step in the second example of the method for manufacturing a semiconductor device according to the first embodiment, illustrated in (2) of FIG. 4A.

FIG. 4C is a top view of the state illustrated in (2) of FIG. 4A. In FIG. 4C, gaps generated between the wafers 2W (the plurality of semiconductor devices 1) divided by dicing are exaggerated and displayed.

Subsequently, as illustrated in (3) of FIG. 4A, a part of the corner of the electrode 3 is removed by the laser ablation processing. For example, the rounded corner X1 is formed by removing a part of the corner having the main surface 31, the side surface 33, and the side surface 34.

Figure 4D:
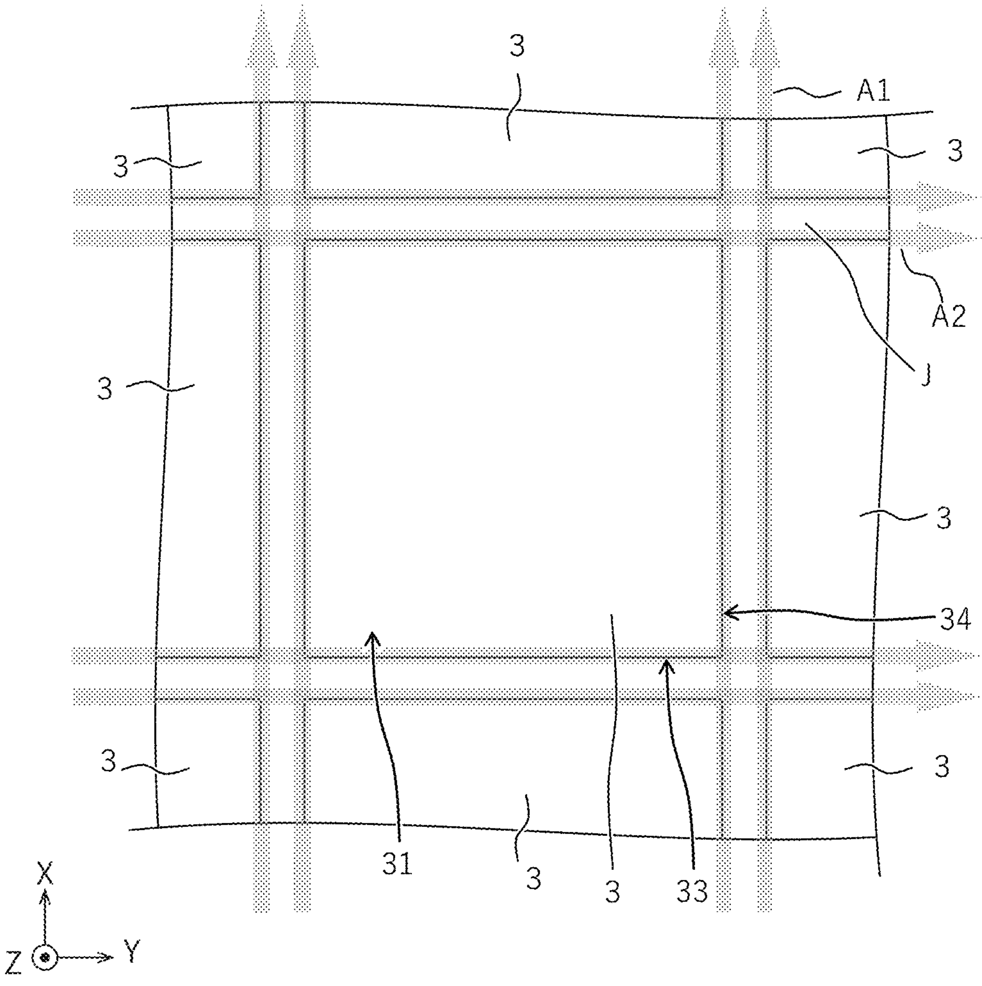
FIG. 4D is a top view for describing a laser processing step in the second example of the method for manufacturing a semiconductor device according to the first embodiment, illustrated in (3) of FIG. 4A.

During the laser ablation processing, for example, as illustrated in FIG. 4D, laser light is applied along sides of the diced wafer 2W (a boundary line between the main surface 31 and the side surface 33 and a boundary line between the main surface 31 and the side surface 34). That is, the laser ablation processing is performed along arrows A1 and A2 illustrated in FIG. 4D. Accordingly, since the laser ablation processing is performed twice at an intersection portion between the arrow A1 and the arrow A2, a removal amount of the electrode 3 increases. Thus, as illustrated in FIG. 2D, the electrode 3 is rounded at the corner X1. In the laser ablation processing, for example, a UV laser is used.

Figure 4E:
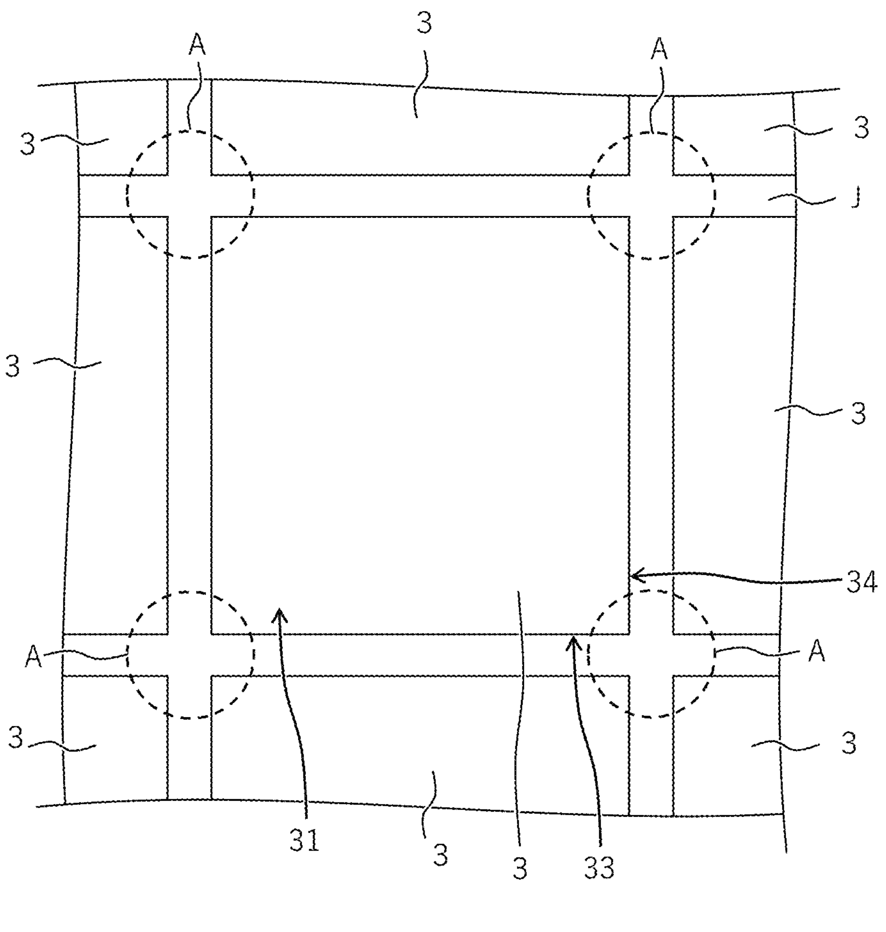
FIG. 4E is a top view for describing another example of the laser processing step in the second example of the method for manufacturing a semiconductor device according to the first embodiment, illustrated in (3) of FIG. 4A.

The laser ablation processing may be selectively performed only on the corner of the electrode 3, for example, as in regions A illustrated in FIG. 4E.

Subsequently, as illustrated in (4) of FIG. 4A, the dicing tape D is attached onto the electrode 3. Thereafter, as illustrated in (1) of FIG. 4B, the dicing tape D is stretched. As illustrated in (2) of FIG. 4B, the divided semiconductor device 1 is pushed up by using the push-up pin P and is picked up by using the collet C.

Through the above steps, the semiconductor device 1 according to the first embodiment is manufactured.

In both the first example or the second example, according to the method for manufacturing the semiconductor device 1, since the electrode 3 is rounded at the corner X1, the semiconductor device 1 can be easily peeled off from the dicing tape D.

In a case where the corner of the back electrode (electrode in contact with the dicing tape) of the semiconductor device is not rounded, when the semiconductor device is picked up, the semiconductor device is hardly peeled off from the dicing tape. In a case where burrs (metal burrs or the like of the back electrode) generated at the time of dicing bite into the dicing tape, the semiconductor device is further hardly peeled off. Since rigidity of the semiconductor device decreases as the semiconductor device is thinned (for example, the thickness is equal to or less than 50 μm), when the dicing tape is deformed by the push-up pin P or the like at the time of picking up, the semiconductor device may also be deformed and damaged.

In contrast, according to the method for manufacturing the semiconductor device 1, since the electrode 3 is rounded at the corner X1, the semiconductor device 1 can be easily peeled off from the dicing tape D. It is possible to reduce a possibility that the burrs generated at the time of dicing bite into the dicing tape D. Accordingly, even though the semiconductor device 1 is thin (for example, the thickness T is equal to or less than 50 μm), a pickup success rate of the semiconductor device 1 can be improved, and a yield of the semiconductor device 1 can be improved.

In both the first example and the second example, the radius of curvature of the corner X1 may be equal to or more than 10 μm. In this case, the semiconductor device 1 is more easily peeled off from the dicing tape D, and the pickup success rate of the semiconductor device 1 can be improved.

Modified Example

Figure 5:
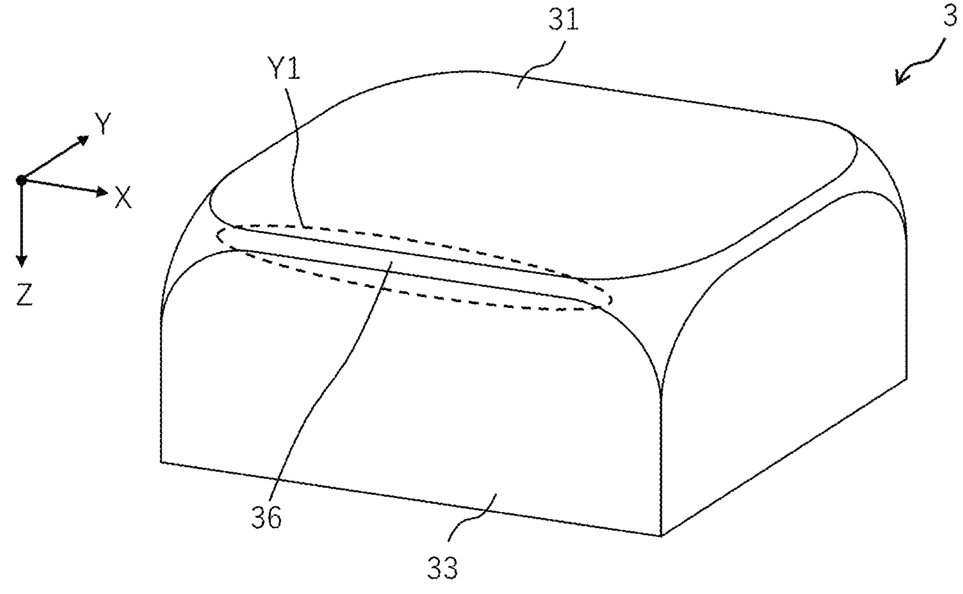
FIG. 5 is a three-dimensional perspective view of a first electrode included in a semiconductor device according to a modified example of the first embodiment.

Next, a modified example of the first embodiment will be described with reference to FIG. 5. As illustrated in FIG. 5, in the present modified example, the main surface 31 and the side surface 33 of the electrode 3 are connected to each other via a curved surface 36. Accordingly, the electrode 3 is rounded at a side portion Y1 including the main surface 31 and the side surface 33. In other words, the electrode 3 includes the rounded side portion Y1.

In the present modified example, as illustrated in FIG. 5, the electrode 3 is rounded not only at one side portion of the main surface 31 but also at all side portions of the main surface 31. The electrode 3 may be rounded on at least one side portion of the main surface 31.

According to the present modified example, since the electrode 3 is rounded also at the side portion Y1, stress applied to the side portion Y1 of the electrode 3 can be dispersed by the bonding material 11 in the semiconductor module 10. Accordingly, durability of the semiconductor device 1 can be further improved.

Since the electrode 3 has the shape as in the present modified example, in a step of picking up the divided semiconductor device 1, the semiconductor device is easily peeled off from the dicing tape D not only at the corner X1 but also at the side portion Y1. Therefore, the pickup of the semiconductor device 1 can be made easier, and the yield can be further improved.

Second Embodiment

Next, a semiconductor device 1A according to a second embodiment will be described. In the first embodiment, it has been described that since the electrode 3 is rounded at the corner X1, the stress can be prevented from concentrating on the corner X1 of the electrode 3 and the durability of the semiconductor device 1 can be improved. In contrast, in the second embodiment, the corner X2 of the semiconductor substrate 2 is also rounded. Accordingly, it is possible to prevent stress from concentrating even on the corner X2 of the semiconductor substrate 2, and it is possible to provide the semiconductor device with further improved durability. Hereinafter, the second embodiment will be described focusing on differences from the first embodiment.

Figure 6A:
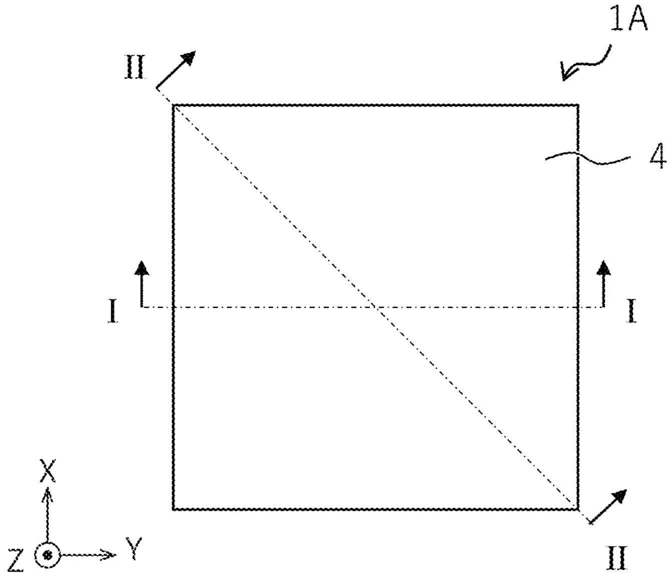
FIG. 6A is a top view of a semiconductor device according to a second embodiment.

FIG. 6A is a top view for describing the semiconductor device 1A according to the second embodiment. Elements having the same names or functions as those in the drawings described in the first embodiment are denoted by the same reference numerals. Hereinafter, the description will be omitted except for the matters changed or added.

Figure 6B:
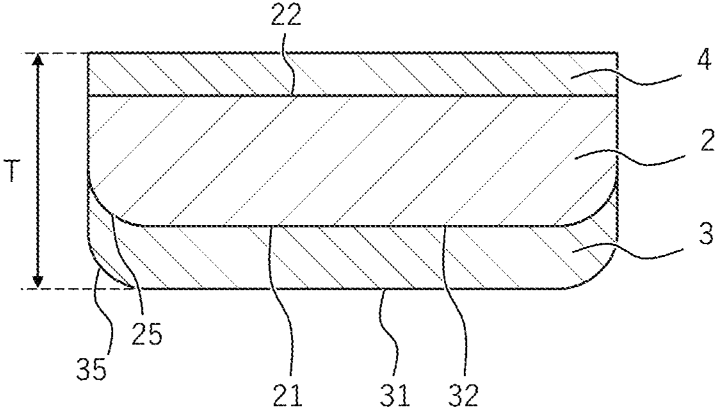
FIG. 6B is a cross-sectional view taken along line II-II of the semiconductor device illustrated in FIG. 6A.

FIG. 6A is a plan view of the semiconductor device 1A according to the second embodiment. FIG. 6B is a cross-sectional view taken along line II-II in FIG. 6A. A cross-sectional view taken along line I-I in FIG. 6A is the same as FIG. 2B described in the first embodiment, and thus, this cross-sectional view is omitted.

The semiconductor substrate 2 has the main surface 21 in contact with the electrode 3, the side surface 23 substantially perpendicularly intersecting with the main surface 21, and the side surface 24 substantially perpendicularly intersecting with both the main surface 21 and the side surface 23.

Figure 6C:
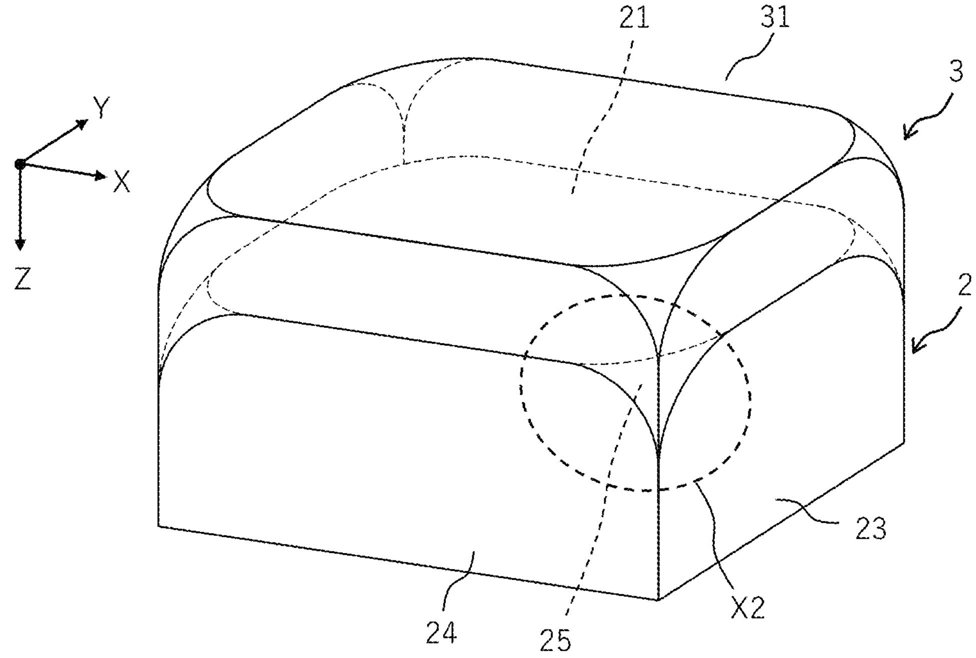
FIG. 6C is a three-dimensional perspective view of a first electrode and a semiconductor substrate included in the semiconductor device according to the second embodiment.

As illustrated in FIGS. 6B and 6C, the main surface 21, the side surface 23, and the side surface 24 of the semiconductor substrate 2 are connected to each other via a curved surface 25. Accordingly, a corner X2 of the semiconductor substrate 2 is rounded. In other words, the semiconductor substrate 2 includes the rounded corner X2. The electrode 3 also has a rounded corner in accordance with the shape of the semiconductor substrate 2 as in the first embodiment. In other words, the electrode 3 also includes the rounded corner X1.

A radius of curvature of the curved surface 25 (that is, a radius of curvature of the corner X2) may be, for example, equal to or more than 10 μm. Accordingly, stress applied to the corner X2 of the semiconductor substrate 2 can be more effectively dispersed.

In the present embodiment, as illustrated in FIG. 6C, the semiconductor substrate 2 is rounded not only at one corner of the main surface 21 but also at all corners of the main surface 21. The semiconductor substrate 2 may be rounded at at least one corner of the main surface 21.

As described above, according to the second embodiment, not only the electrode 3 but also the semiconductor substrate 2 is rounded at the corner X2. Therefore, the stress applied to the corner X2 of the semiconductor substrate 2 can be dispersed. Accordingly, the durability of the semiconductor device 1A can be further improved. For example, even in a case where the electrode 3 is thin due to the thinning of the semiconductor device, according to the present embodiment, since the semiconductor substrate 2 is also rounded at the corner X2, the durability of the semiconductor device 1A can be maintained and improved.

Although it has been described that the electrode 3 is rounded at the corner X1 In the first embodiment, in the second embodiment, the semiconductor substrate 2 is rounded at the corner X2. Therefore, the second embodiment can be similarly applied to a case where the electrode is not disposed on the main surface 21 (a case where the electrode is disposed only on one main surface of the semiconductor substrate 2) such as a case where the semiconductor device 1 is a lateral MOSFET.

<Method for Manufacturing Semiconductor Device 1A>

Figure 7A:
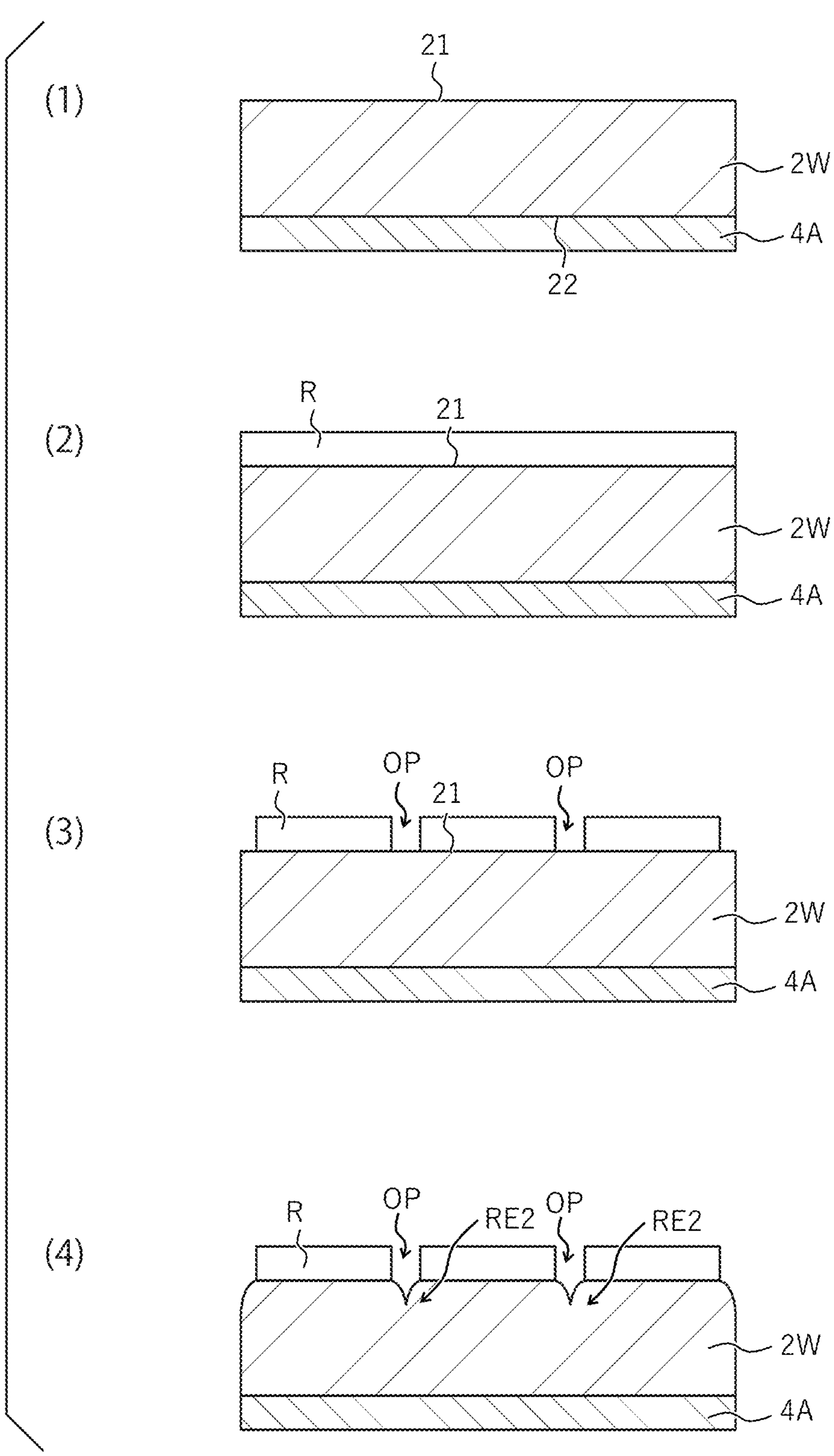
FIG. 7A is a cross-sectional view for describing steps in a first example of a method for manufacturing a semiconductor device according to the second embodiment.
Figure 7B:
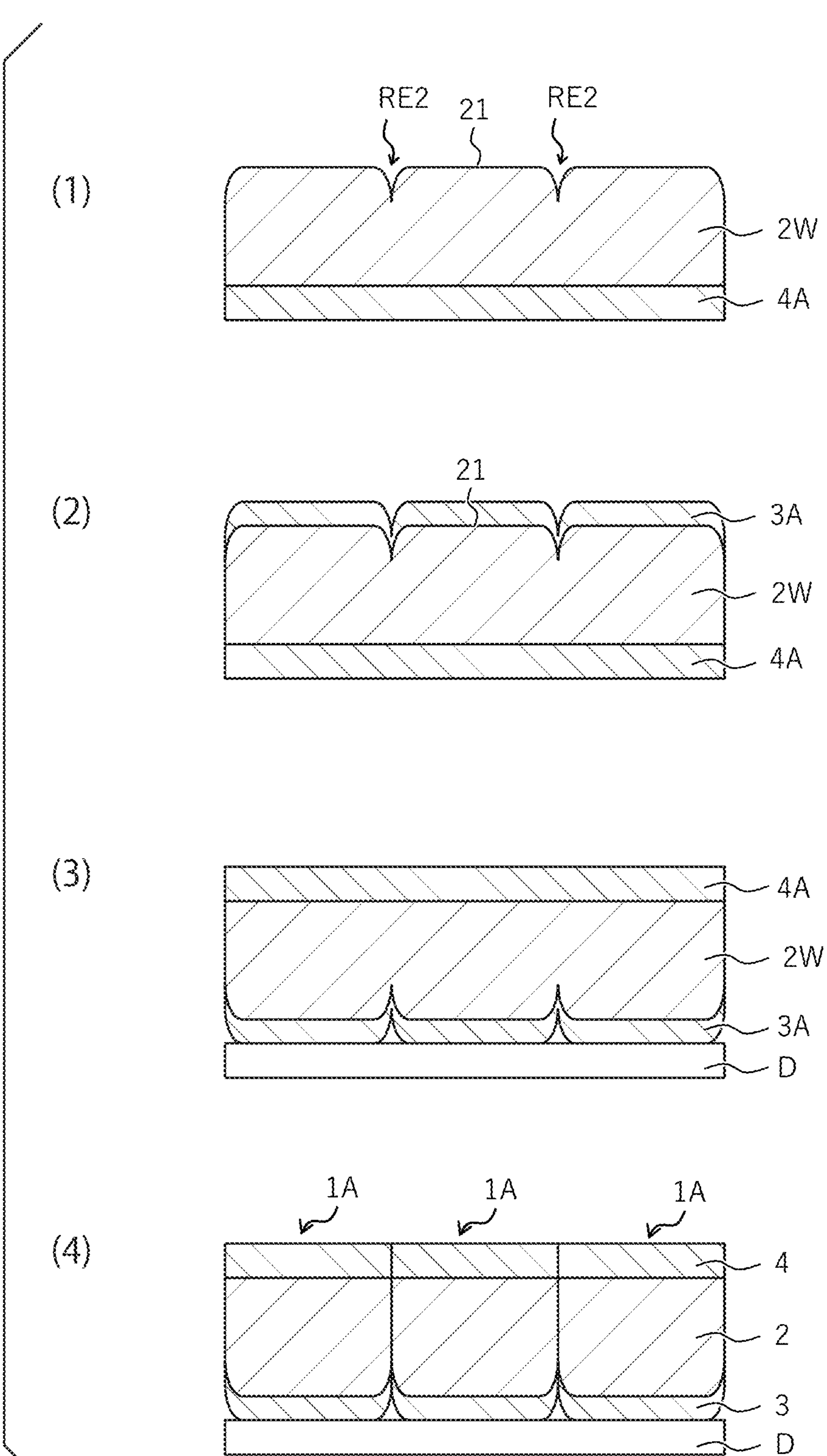
FIG. 7B is a cross-sectional view for describing steps in the first example of the method for manufacturing a semiconductor device according to the second embodiment, subsequently to FIG. 7A.
Figure 7C:
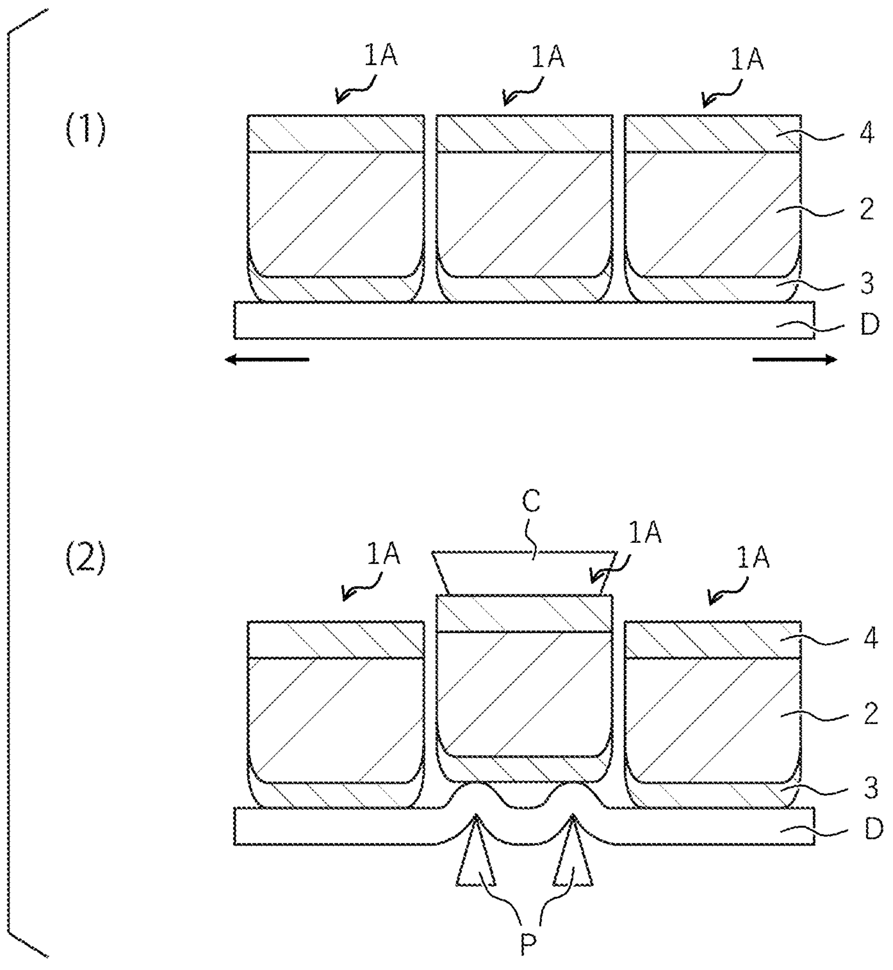
FIG. 7C is a cross-sectional view for describing steps in the first example of the method for manufacturing a semiconductor device according to the second embodiment, subsequently to FIG. 7B.
Figure 8A:
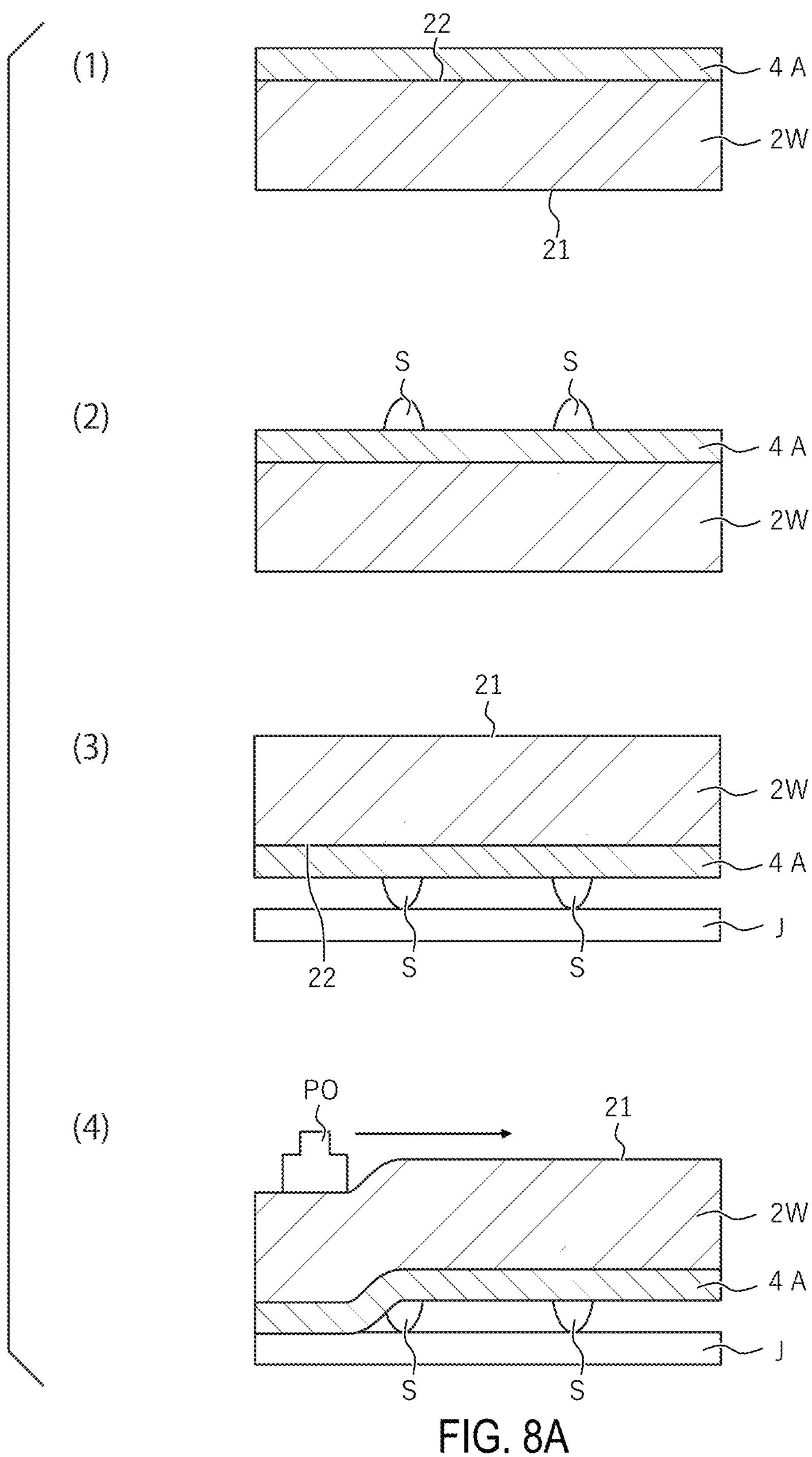
FIG. 8A is a cross-sectional view for describing steps in a second example of the method for manufacturing a semiconductor device according to the second embodiment.
Figure 8B:
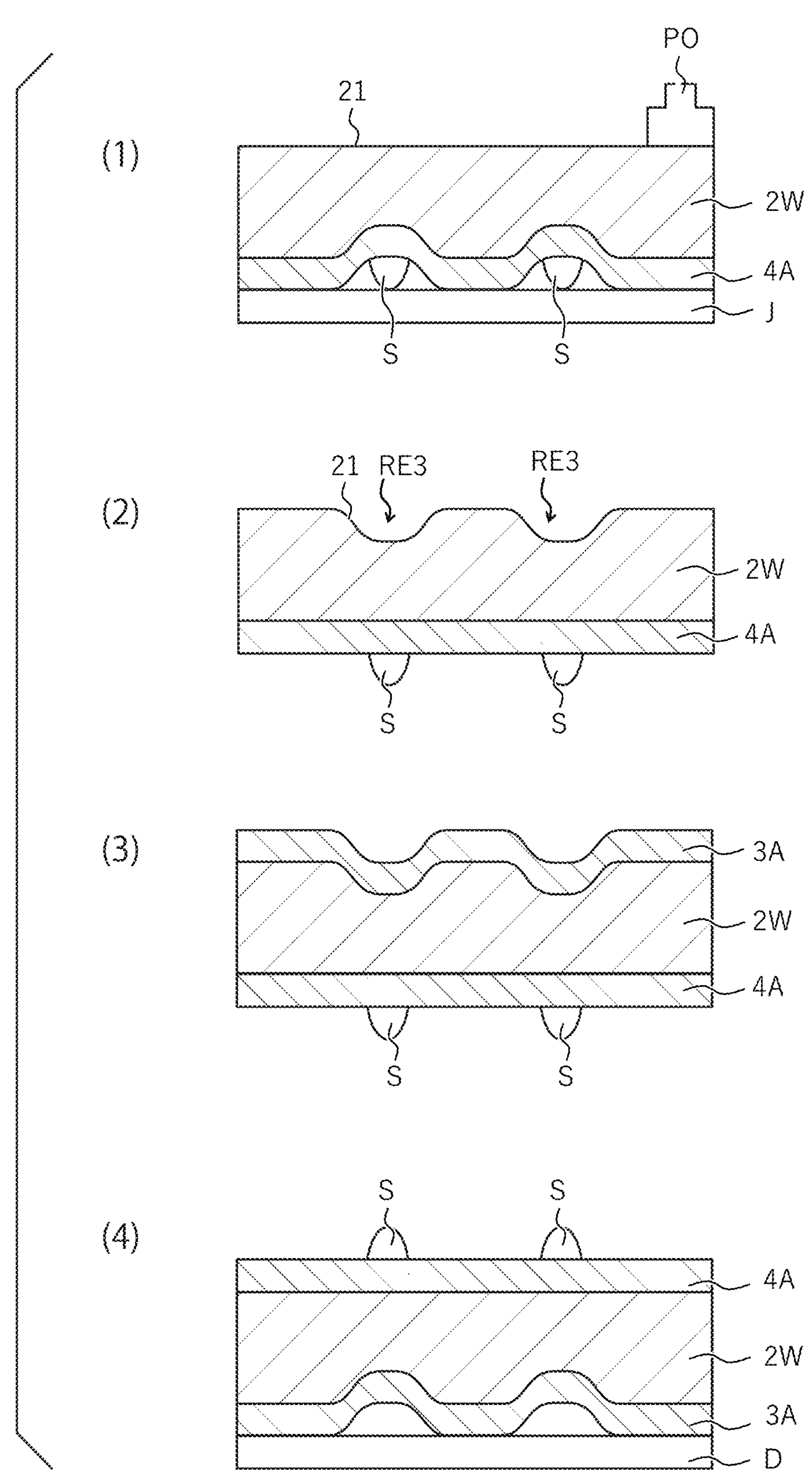
FIG. 8B is a cross-sectional view for describing steps in the second example of the method for manufacturing a semiconductor device according to the second embodiment, subsequently to FIG. 8A.
Figure 8C:
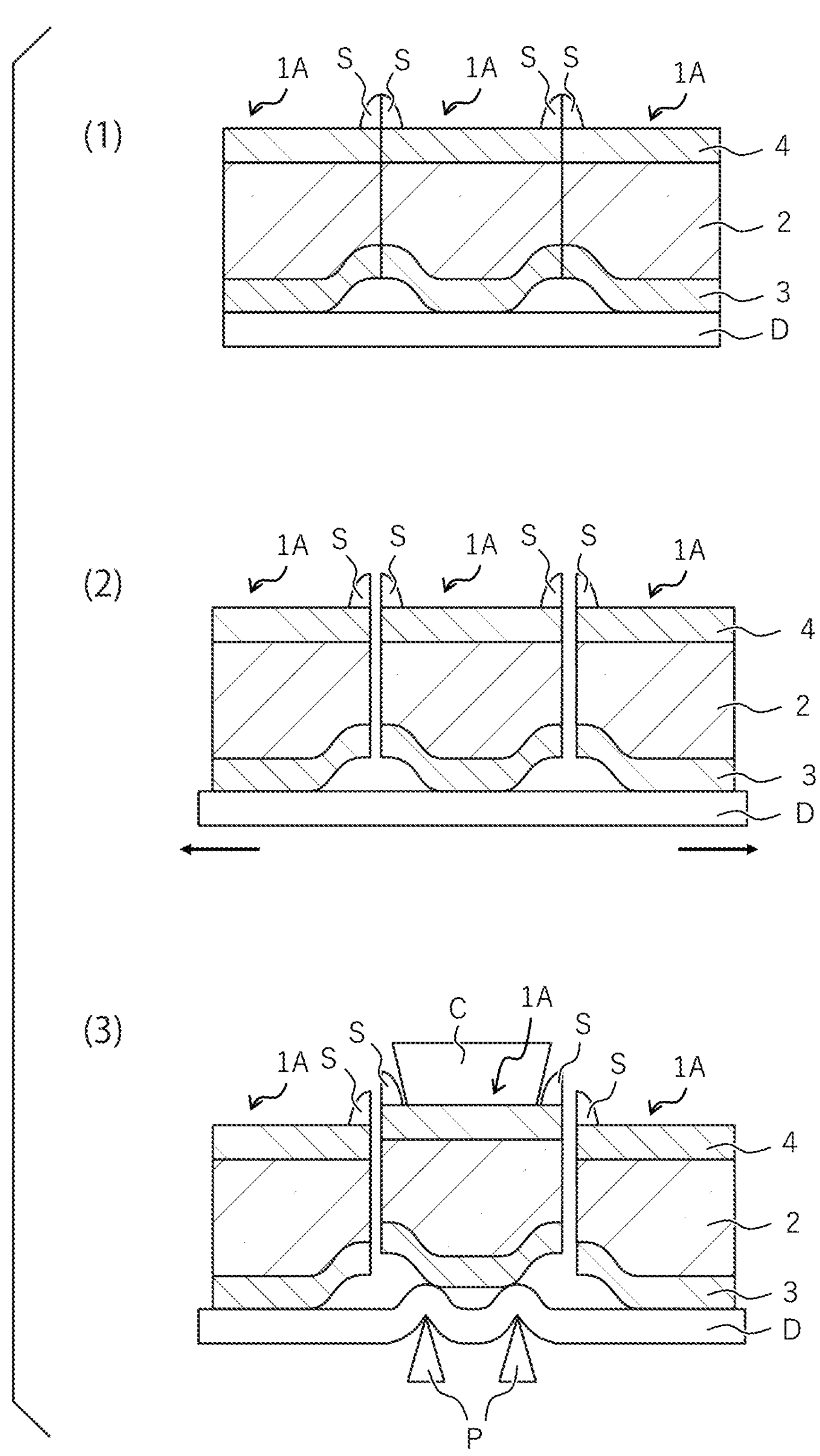
FIG. 8C is a cross-sectional view for describing steps in the second example of the method for manufacturing a semiconductor device according to the second embodiment, subsequently to FIG. 8B.

Hereinafter, a method for manufacturing the semiconductor device 1A will be described with reference to the drawings. As an example of a manufacturing method for rounding the corner X2, a manufacturing method using etching or a spacer will be described. FIGS. 7A to 7C illustrate a manufacturing method by etching (third example), and FIGS. 8A to 8C illustrate a method using a spacer (fourth example).

Third Example (Etching)

First, as illustrated in (1) of FIG. 7A, the wafer 2W having the main surface 21 and the main surface 22 opposite to the main surface 21 and having the electrode layer 4A disposed on the main surface 22 is prepared. For reinforcement, the wafer 2W may be bonded to a support member (not illustrated) such as a glass plate.

Subsequently, as illustrated in (2) of FIG. 7A, the resist R is applied onto the main surface 21 of the wafer 2W.

Subsequently, as illustrated in (3) of FIG. 7A, the resist R is selectively exposed at the position corresponding to the intersection of the dicing lines L of the wafer 2W. Thereafter, development is performed, and thus, the opening OP through which the main surface 21 is exposed is formed in the lattice point shape (that is, at the position corresponding to the intersection of the dicing lines L) on the bottom surface. Similarly to the first example, the opening OP is formed in the lattice point shape at the position corresponding to the intersection of the dicing lines L. The shape of the opening OP may be any shape such as a circular shape.

Subsequently, as illustrated in (4) of FIG. 7A, the semiconductor substrate 2 exposed on the bottom surface of the opening OP is etched, and thus, a plurality of recesses RE2 are formed in a lattice point shape in the semiconductor substrate 2. A depth of the recess RE2 is, for example, equal to or more than 10 μm. The etching is dry etching or wet etching. The recesses RE2 are formed, and thus, the semiconductor substrate 2 is rounded at the corner X2 when the wafer 2W is divided into a plurality of semiconductor devices 1A later.

Subsequently, as illustrated in (1) of FIG. 7B, the resist R is removed by using a developer or the like. Accordingly, the recess RE2 is disposed along the intersection of the dicing lines L.

Subsequently, as illustrated in (2) of FIG. 7B, the electrode layer 3A is formed in the main surface 21 of the wafer 2W. For example, the electrode layer 3A is formed in the main surface 21 by a vapor deposition method, a sputtering method, or the like.

Subsequently, as illustrated in (3) of FIG. 7B, the dicing tape D is attached onto the electrode layer 3A. Thereafter, in a case where the support member such as the glass plate is bonded to the wafer 2W, the support member is removed.

Subsequently, as illustrated in (4) of FIG. 7B, the wafer 2W is diced along the dicing lines L, and thus, the wafer 2W is divided into the plurality of semiconductor devices 1A. The dicing is performed by any method such as blade dicing or laser dicing.

Subsequently, as illustrated in (1) of FIG. 7C, the dicing tape D is stretched. As illustrated in (2) of FIG. 7C, the divided semiconductor device 1A is pushed up by using the push-up pin P and is picked up by using the collet C.

Through the above steps, the semiconductor device 1A according to the second embodiment is manufactured.

Next, the method for manufacturing the semiconductor device 1A using the spacer will be described.

Fourth Example (Spacer)

First, as illustrated in (1) of FIG. 8A, the wafer 2W having the main surface 21 and the main surface 22 opposite to the main surface 21 and having the electrode layer 4A disposed on the main surface 22 is prepared. For reinforcement, the wafer 2W may be bonded to a support member (not illustrated) such as a glass plate.

Figure 8D:
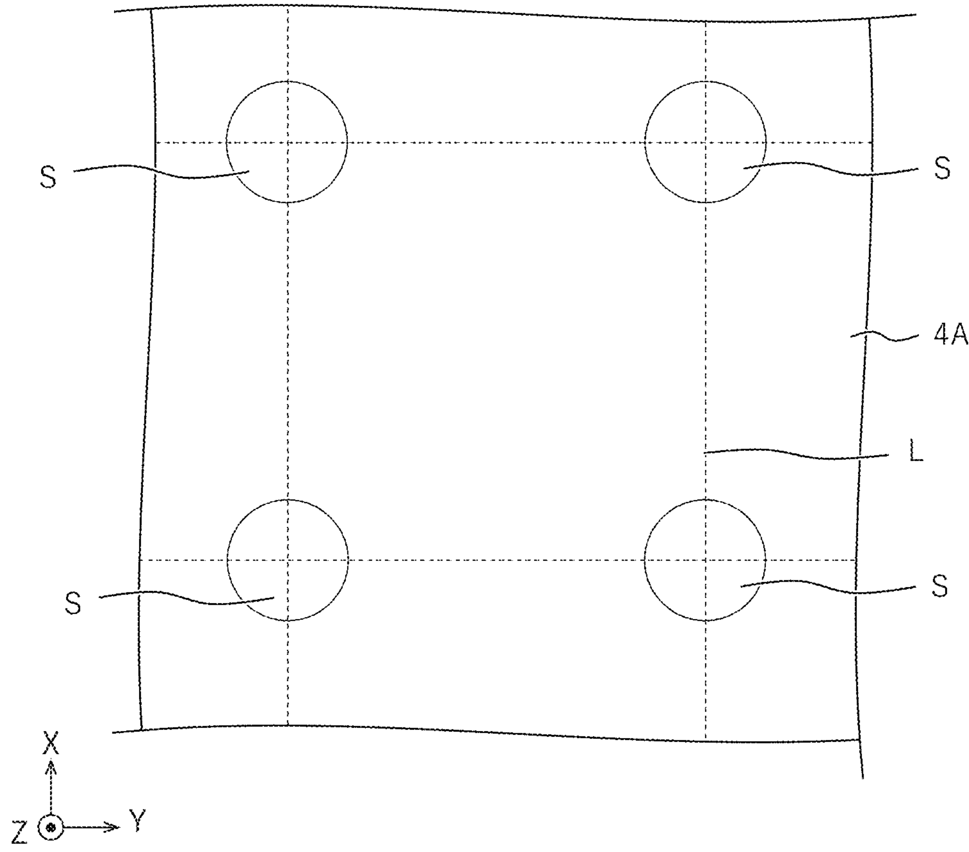
FIG. 8D is a top view for describing the step in the second example of the method for manufacturing a semiconductor device according to the second embodiment, illustrated in (2) of FIG. 8A.

Subsequently, as illustrated in (2) of FIG. 8A and FIG. 8D, spacers S are formed in a lattice point shape on the electrode layer 4A at positions corresponding to intersections of predetermined dicing lines L of the wafer 2W. The spacer S is made of, for example, polyimide. FIG. 8D is a top view of the state illustrated in (1) of FIG. 8A. A height (thickness) of the spacer S is, for example, equal to or more than 10 μm.

Subsequently, as illustrated in (3) of FIG. 8A, the wafer 2W is disposed on the support jig J such that the main surface 22 side faces the support jig J.

Subsequently, as illustrated in (4) of FIG. 8A and (1) of FIG. 8B, the main surface 21 side of the wafer 2W is ground by using a grinding machine PO (back grinding step). At this time, the grinding machine PO grinds the wafer 2W while pressing the wafer against the support jig J. Thus, since a stronger pressure is applied to a portion of the wafer 2W where the spacer S is formed than a portion where the spacer S is not formed, a grinding amount increases.

During the grinding of the wafer 2W, since the wafer 2W is pressed against the support jig J by the grinding machine PO, the wafer 2W (and the electrode layer 4A) is distorted as illustrated in (1) of FIG. 8B. When the grinding is completed and a pressing force of the grinding machine PO disappears, the shape of the wafer 2W returns to an original shape as illustrated in (2) of FIG. 8B. As a result, portions positioned directly above the spacer S are recessed, and recesses RE3 are formed in the main surface 21. The recesses RE3 are formed, and thus, the semiconductor substrate 2 is rounded at the corner X1 when the wafer 2W is divided into a plurality of semiconductor devices 1A later. When the height of the spacer S is equal to or more than 10 μm, a depth of the recess RE3 is, for example, equal to or more than 10 μm Subsequently, as illustrated in (3) of FIG. 8B, the electrode layer 3A is formed in the main surface 21 of the wafer 2W. For example, the electrode layer 3A is formed in the main surface 21 by a vapor deposition method, a sputtering method, or the like.

Subsequently, as illustrated in (4) of FIG. 8B, the dicing tape D is attached onto the electrode layer 3A. Thereafter, as illustrated in (1) of FIG. 8C and FIG. 8E, the wafer 2W is diced along the dicing lines L, and thus, the wafer 2W is divided into the plurality of semiconductor devices 1A. The dicing is performed by any method such as blade dicing or laser dicing.

Figure 8E:
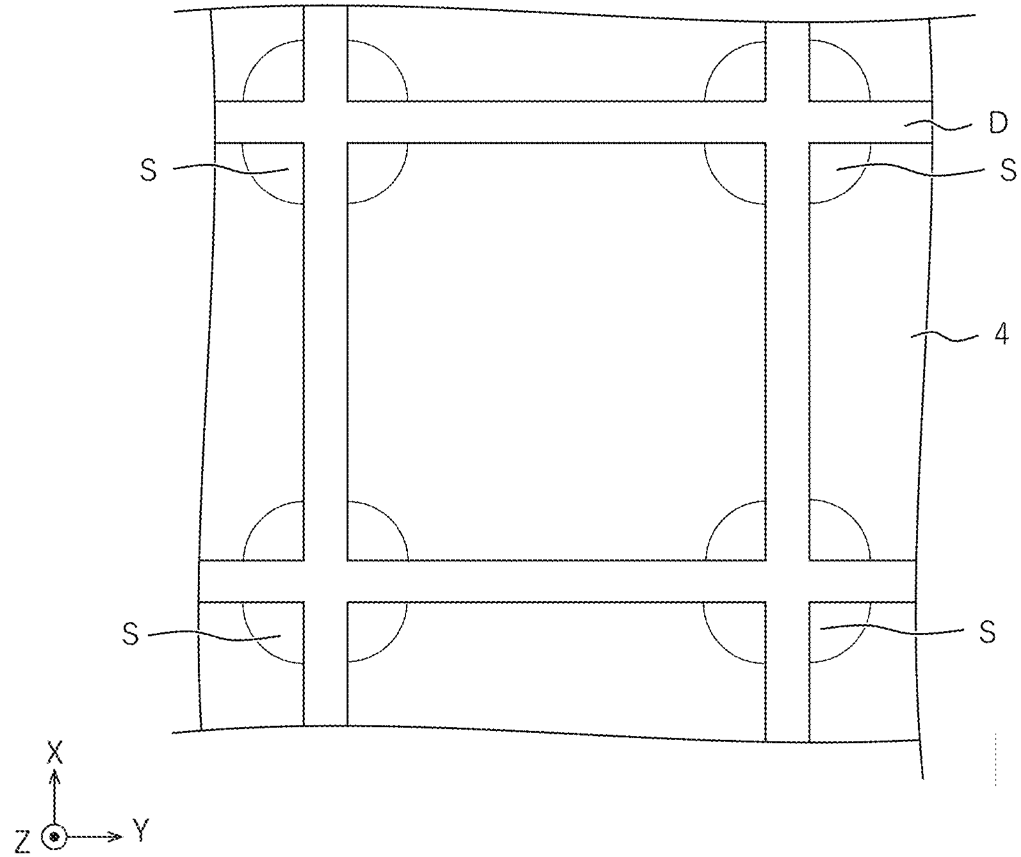
FIG. 8E is a top view for describing the step in the second example of the method for manufacturing a semiconductor device according to the second embodiment illustrated in (2) of FIG. 8C.

Subsequently, as illustrated in (2) of FIG. 8C and FIG. 8E, the dicing tape D is stretched. Thereafter, as illustrated in (3) of FIG. 8C, the divided semiconductor device 1A is pushed up by using the push-up pin P and is picked up by using the collet C.

Through the above steps, the semiconductor device 1A according to the second embodiment is manufactured.

Although the spacers S are not removed from the semiconductor device 1A in the above description, the spacers S may be removed from the semiconductor device 1A. A so-called pre-dicing method for performing dicing before the back grinding step may be adopted.

In both the third example or the fourth example, according to the method for manufacturing the semiconductor device 1A, the corner X2 of the semiconductor substrate 2 is rounded, and thus, the corner X1 of the electrode 3 is also rounded. Thus, similarly to the method for manufacturing the semiconductor device 1 according to the first embodiment, the semiconductor device 1A can also be easily peeled off from the dicing tape D by the method for manufacturing the semiconductor device 1A according to the second embodiment. It is possible to reduce the possibility that the burrs (metal burrs or the like of the electrode 3) generated at the time of dicing bite into the dicing tape D. Accordingly, even in a case where the semiconductor device 1A is thin, the pickup success rate of the semiconductor device 1A can be improved, and the yield of the semiconductor device 1A can be improved.

In both the third example or the fourth example, the radius of curvature of the corner X2 may be equal to or more than 10 μm. In this case, the radius of curvature of the corner X1 is also equal to or more than 10 μm in accordance with the shape (roundness) of the corner X2. Accordingly, the semiconductor device 1A is more easily peeled off from the dicing tape D, and the pickup success rate of the semiconductor device 1A can be improved.

Modified Example

Figure 9:
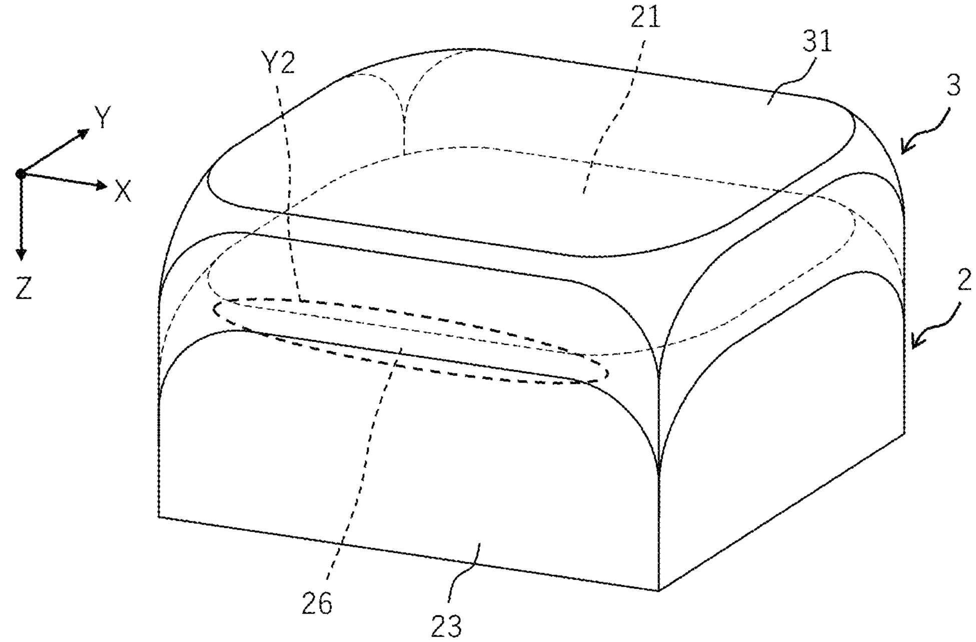
FIG. 9 is a three-dimensional perspective view of a first electrode and a semiconductor substrate included in a semiconductor device according to a modified example of the second embodiment.

Next, a modified example of the second embodiment will be described with reference to FIG. 9. As illustrated in FIG. 9, in the present modified example, the main surface 21 and the side surface 23 of the semiconductor substrate 2 are connected to each other via a curved surface 26. Accordingly, the semiconductor substrate 2 is also rounded at a side portion Y2 including the main surface 21 and the side surface 23. In other words, the semiconductor substrate 2 has the rounded side portion Y2.

In the present embodiment, as illustrated in FIG. 9, the semiconductor substrate 2 is rounded not only at one side portion of the main surface 21 but also at all side portions of the main surface 21. The semiconductor substrate 2 may be rounded on at least one side portion of the main surface 21.

According to the present modified example, since the semiconductor substrate 2 is rounded not only at the corner X2 but also at the side portion Y2, stress applied to the side portion Y2 can be dispersed. Accordingly, the durability of the semiconductor device 1A can be further improved.

In addition, since the semiconductor substrate 2 has the shape as in the present modified example, since the semiconductor device is easily peeled off from the dicing tape D not only at the corner X2 but also at the side portion Y2 in the manufacturing step, it is possible to more easily pick up the semiconductor device 1A and further improve the yield of the semiconductor device 1A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:

a first electrode that has a first main surface and a second main surface opposite to the first main surface;

a semiconductor substrate that is disposed on the second main surface; and a second electrode that is disposed on a fourth main surface of the semiconductor substrate opposite to a third main surface in contact with the first electrode, wherein the first electrode has a first side surface substantially perpendicularly intersecting with the first main surface, and a second side surface substantially perpendicularly intersecting with both the first main surface and the first side surface, and the first main surface, the first side surface, and the second side surface are connected to each other via a curved surface.

2. The semiconductor device according to claim 1, wherein the first electrode is rounded at all corners of the first main surface.

3. The semiconductor device according to claim 1, wherein the first main surface and the first side surface are connected to each other via a curved surface.

4. The semiconductor device according to claim 3, wherein the first electrode is rounded at all side portions of the first main surface.

5. The semiconductor device according to claim 1, wherein a total of thicknesses of the first electrode, the semiconductor substrate, and the second electrode is equal to or less than 50 μm.

6. The semiconductor device according to claim 1, wherein a radius of curvature of the curved surface is equal to or more than 10 μm.

7. The semiconductor device according to claim 1, wherein the semiconductor device is a vertical MOSFET, the first electrode is a drain electrode, and the second electrode is a source electrode.

8. A semiconductor module comprising:

the semiconductor device according to claim 1;

a first metal member that is electrically connected to the first electrode;

a second metal member that is electrically connected to the second electrode; and a sealing material that seals the semiconductor device.

9. The semiconductor device according to claim 1, wherein the semiconductor substrate has the third main surface, a third side surface substantially perpendicularly intersecting with the third main surface, and a fourth side surface substantially perpendicularly intersecting with both the third main surface and the third side surface, and the third main surface, the third side surface, and the fourth side surface are connected to each other via a second curved surface.

10. The semiconductor device according to claim 9, wherein the semiconductor substrate is rounded at all corners of the third main surface.

11. The semiconductor device according to claim 9, wherein the third main surface and the third side surface are connected to each other via a curved surface.

12. The semiconductor device according to claim 11, wherein the semiconductor substrate is rounded at all side portions of the third main surface.

13. The semiconductor device according to claim 9, wherein a total of thicknesses of the first electrode, the semiconductor substrate, and the second electrode is equal to or less than 50 μm.

14. The semiconductor device according to claim 9, wherein a radius of curvature of at least one of the curved surface and the second curved surface is equal to or more than 10 μm.

15. The semiconductor device according to claim 9, wherein the semiconductor device is a vertical MOSFET, the first electrode is a drain electrode, and the second electrode is a source electrode.

16. A semiconductor module comprising:

the semiconductor device according to claim 9;

a first metal member that is electrically connected to the first electrode;

a second metal member that is electrically connected to the second electrode; and a sealing material that seals the semiconductor device.

* * * * *